US012306226B2

(12) United States Patent
Roy et al.

(10) Patent No.: US 12,306,226 B2
(45) Date of Patent: May 20, 2025

(54) INTELLIGENT NON-INTRUSIVE LOAD MONITORING SYSTEM

(71) Applicant: Purdue Research Foundation, West Lafayette, IN (US)

(72) Inventors: Kaushik Roy, West Lafayette, IN (US); Byunghoo Jung, West Lafayette, IN (US); Chamika Mihiranga Liyanagedera, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 325 days.

(21) Appl. No.: 17/779,468

(22) PCT Filed: Sep. 30, 2020

(86) PCT No.: PCT/US2020/053598
§ 371 (c)(1),
(2) Date: May 24, 2022

(87) PCT Pub. No.: WO2021/101630
PCT Pub. Date: May 27, 2021

(65) Prior Publication Data
US 2023/0341446 A1 Oct. 26, 2023

Related U.S. Application Data

(60) Provisional application No. 62/967,410, filed on Jan. 29, 2020, provisional application No. 62/939,676, filed on Nov. 24, 2019.

(51) Int. Cl.
*G01R 21/00* (2006.01)
*G01R 21/06* (2006.01)
*G01R 21/133* (2006.01)

(52) U.S. Cl.
CPC ....... *G01R 21/1331* (2013.01); *G01R 21/006* (2013.01); *G01R 21/06* (2013.01)

(58) Field of Classification Search
CPC ... G01R 21/1331; G01R 21/006; G01R 21/06
See application file for complete search history.

(56) References Cited

U.S. PATENT DOCUMENTS

| 5,483,153 A * | 1/1996 | Leeb | G01R 21/1331 340/657 |
| 8,311,754 B2 * | 11/2012 | Alles | H02J 13/00002 702/57 |

(Continued)

OTHER PUBLICATIONS

International Search Report & Written Opinion dated Dec. 29, 2020 for International Application No. PCT/US2020/053598, 9 pages.

(Continued)

*Primary Examiner* — Elias Desta
(74) *Attorney, Agent, or Firm* — Hartman Global IP Law; Gary M. Hartman; Domenica N. S. Hartman

(57) ABSTRACT

A system may include a non-intrusive sensor circuitry configured to provide electrical measurement data, including, for example, current data, voltage data, power factor data, active power consumption data, reactive power consumption data, or a combination thereof. A transient event detector may sweep the electrical measurement data with a first window and a second window, the first window adjacent to the second window. The transient event detector may identify a start and end of transient activity based on electrical measurement data referenced by separate adjacent windows. The transient event detector may capture a transient activity data segment comprising a portion of the electrical measurement data between first index and the second index.

16 Claims, 7 Drawing Sheets

(56) References Cited

U.S. PATENT DOCUMENTS

| | | | | |
|---|---|---|---|---|
| 9,453,869 B1* | 9/2016 | Parkin | ................ | G01R 19/2513 |
| 2012/0290230 A1* | 11/2012 | Berges Gonzalez | ........................ | |
| | | | | G05B 19/0428 |
| | | | | 702/61 |
| 2014/0207398 A1* | 7/2014 | Lai | ........................ | G01D 4/00 |
| | | | | 702/61 |
| 2016/0069937 A1* | 3/2016 | Johnson | ............. | G01R 19/0084 |
| | | | | 324/126 |
| 2018/0306839 A1* | 10/2018 | Donnal | ................ | G01R 21/133 |

OTHER PUBLICATIONS

English/Korean Translation of Preliminary Rejection for Korean Application No. 2022/7021618 (20-pages).

\* cited by examiner

INTELLIGENT NON-INTRUSIVE LOAD MONITORING SYSTEM

CROSS REFERENCE TO RELATED APPLICATIONS

This application is a nationalization under 35 U.S. Code § 371 of PCT Application No. PCT/US20/53598 filed Nov. 24, 2020, which claims the benefit of U.S. provisional application 62/939,676 filed Nov. 24, 2019 and U.S. Provisional Application No. 62/967,410 filed Jan. 29, 2020, the entireties of these applications are incorporated by reference herein.

TECHNICAL FIELD

This disclosure relates to electrical load monitoring and, in particular, to machine learning and non-intrusive load monitoring.

BACKGROUND

Non-intrusive Load Monitoring (NILM) is the technique of determining the operating condition of different electrical appliances or processes connected to a system using a limited number of sensors. In NILM a single current sensor is installed at the power supply entrance to measure the total aggregated current consumption of multiple devices. By analyzing the transient patterns in the total aggregated current, it is possible to determine the operating conditions of the devices connected to the system, given that enough prior information is available. NILM is traditionally implemented for energy management and fault diagnosis by utility companies, in Home Energy Management Systems (HEMS), in Building Energy Management Systems (BEMS), in Factory Energy Management Systems (FEMS), and in Community Energy Management Systems (CEMS).

Applying NILM to a household can give you a granulized energy bill that is broken down to the energy consumption of each individual appliance to induce greater energy savings. Studies have shown that real time information down to the appliance level can potentially save 12% of the monthly energy bill. Additionally, NLIM can notify the user when a device is experiencing a problem before an appliance or system failure occurs so necessary corrective measures can be taken. Users can introduce intelligence to their entire household without investing in IoT-enabled appliances using a single current sensor. Utility companies can use NILM to identify different consumer behaviors and generate revenue through targeted advertising efforts. Utilities can also use NILM to determine strategic locations for solar PV installations and efficient control and management of distributed storages. NILM is also important in smart factory applications where with a limited number of strategically placed sensors it is possible to monitor and evaluate the performance of an entire production line. However, present approaches to NILM suffer a variety of drawbacks, limitations, and inefficiencies. For example, present approaches NILM fail to take advantage of feature extraction based on high accuracy electrical sensors. In addition, present approaches fail to accurately differentiate between devices and processes based on efficient machine learning and analysis.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

This disclosure presents a system and methods for non-intrusive load monitoring (NLM). A high accuracy non-invasive current sensor may provide high accuracy data on the current consumption, reactive power consumption, active power consumption, power factor and harmonics in real time at a high report rate (i.e. greater than 1 ksps). The system and methods described herein take advantage of high report rights by providing various technical advancements related to transient activity identification, classification, and learning. By way of introductory example a system may include a non-intrusive sensor circuitry configured to provide electrical measurement data, including, for example, current data, voltage data, power factor data, active power consumption data, reactive power consumption data, or a combination thereof.

The system may further include a transient event detector. The transient event detector may sweep the electrical measurement data with a first window and a second window, the first window adjacent to the second window. The transient event detector may identify, at a first index of the electrical measurement data, a start of transient activity based on electrical measurement data referenced by a first window and electrical measurement data referenced by the second window. The transient event detector may identify, at a second index of the electrical measurement data, an end of transient activity based on electrical measurement data referenced by the first window and electrical measurement data referenced by the second window. The transient event detector may capture a transient activity data segment comprising a portion of the electrical measurement data between first index and the second index.

In some examples, a transient event detector may identify current or power transients present in the captured data and run pattern recognition to identify the operating conditions of different devices. The scanning techniques described herein provide accurate identification of transient activity where clipping and noise are minimized.

Figure 1:
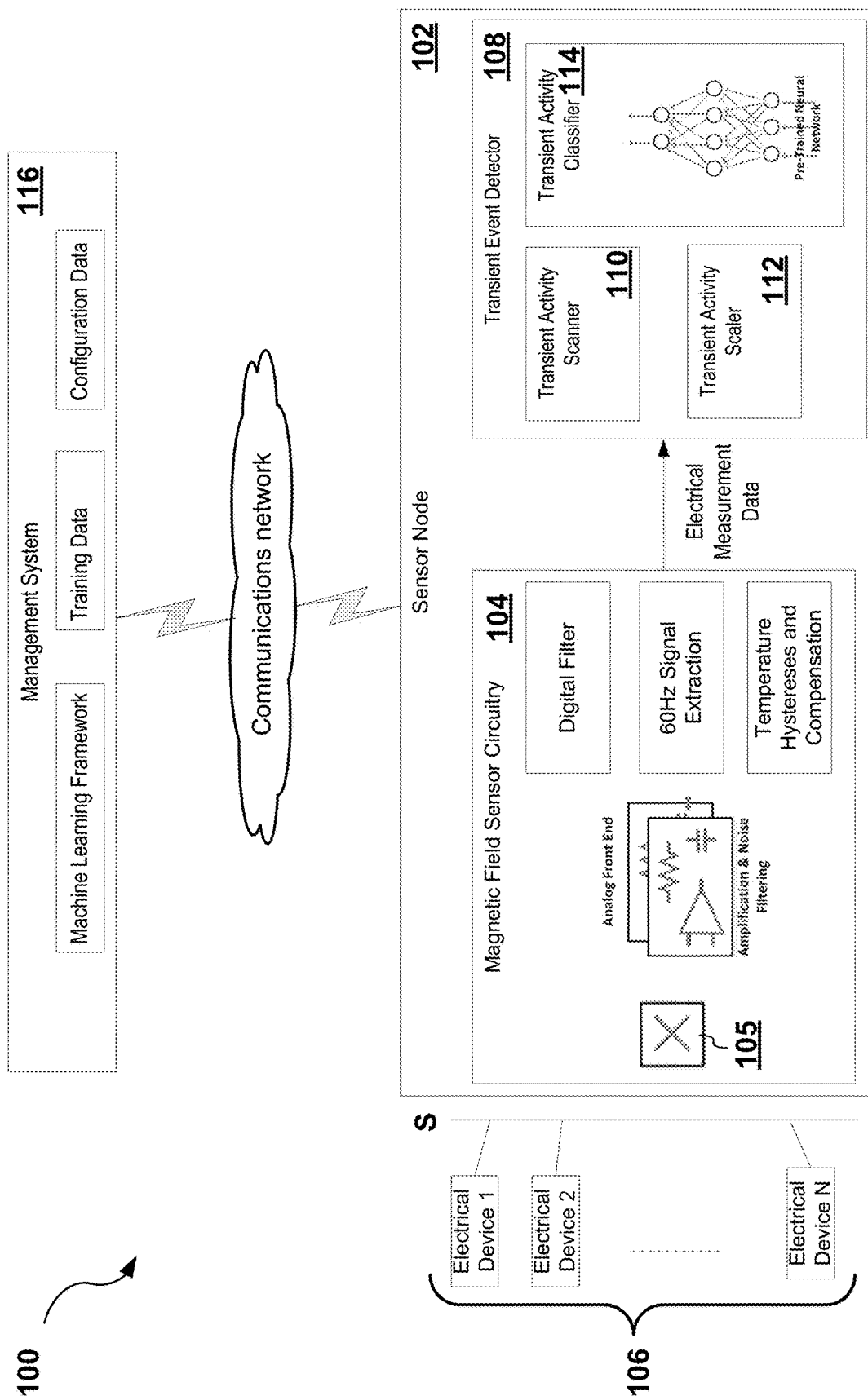
FIG. 1 illustrates an example of a non-intrusive load monitoring system.

FIG. 1 illustrates an example of a non-intrusive load monitoring system 100. The system 100 may include a sensor node 102. The sensor node 102 may include sensor circuitry 104 attached or arranged at a supply line S connected to one or more electrical devices 106.

The sensor circuitry 104 may generate electrical measurement data based on magnetic fields detected near a conductor, such as the supply line S. The electrical measurement data may include a measurement of the magnetic fields and/or measurement information derived from the magnetic field measured from the supply line S. For example, the sensor circuitry 104 may derive real time information including total aggregated current consumption, total active power consumption, total reactive power consumption, terminal voltages, power factor and harmonics, or a combination thereof. The sensor circuitry 104 may operate at a high report rate, for example, 3 ksps. In various examples, the sensor circuitry may include among other components, a non-intrusive magnetic field sensor 105. Examples of the magnetic field sensor 105 may include Hall effect sensors, Giant Magneto Resistive (GMR) sensors, Tunneling Magneto Resistive (TMR) sensors. The sensor circuitry 104 may include additional or alternative circuitry described in U.S. Provisional Application No. 62/967,404, titled HIGH ACCURACY NON-INVASIVE CURRENT SENSOR SYSTEM, which is incorporated by reference herein.

The system 100 may further include a transient event detector 108. The transient event detector 108 may capture electrical measurement data and identify transient events. A transient event is defined as a detection of transient activity or information that identifies or indexes electrical measurement data corresponding to a transient activity. Transient activity is captured with electrical measurement data representative of transient electrical behavior. In some examples, the transient activity may be stored or arranged in a data structure. A set of electrical measurement data may include transient activity between two position indices. For example, the position indices may include time, memory location, database row #, or other suitable index values that reference a particular location in a set of electrical measurement data. In the various examples described herein, time is used for ease of explanation, but other suitable index values may be used. Accordingly, transient activity may include and/or reference electrical measurement data between a start index (e.g., start time) and a stop index (e.g., stop time). A transient event may include or reference transient activity. For example, the transient event may include a data structure that includes position indices that reference stored or streaming transient activity. Alternatively, the transient event may include the transient activity. In various examples, the transient event may include additional information, such as classification information related to the transient event and/or other data related to the transient activity, as described herein.

Figure 2:
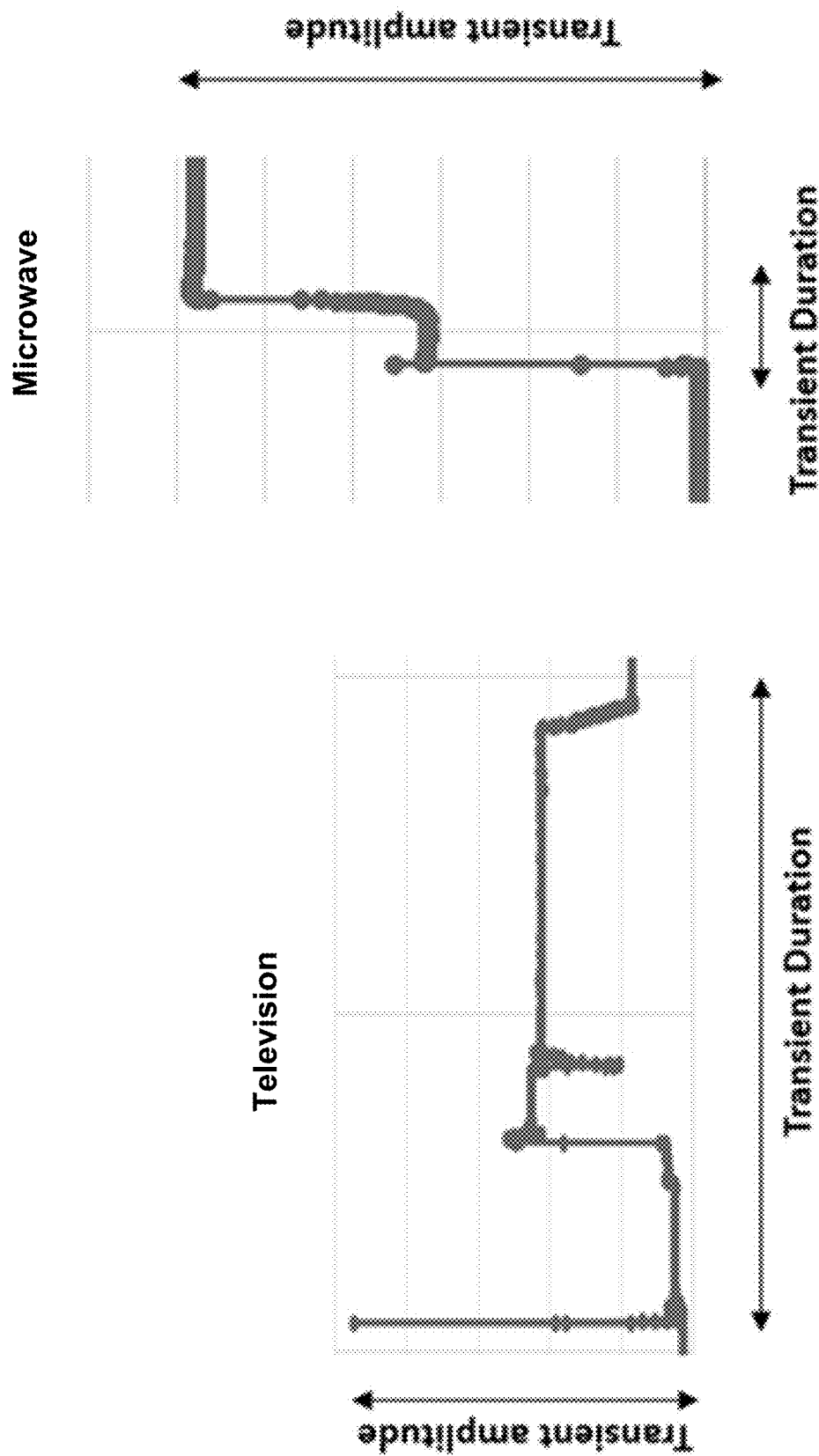
FIG. 2 illustrates an example of turn on transient activity of a television and a microwave.

Its important to note that transient activity may provide a signature for a particular electronic device or particular categorization(s) of electronic device. For example, the length (and amplitude) of such transient activity may vary from device to device. FIG. 2 illustrates an example of turn on transient activity of a television and a microwave. Accurate identification and/or pre-processing of the transient activity is important for identification of the underlying electronic device or categorization of electronic devices.

The system may include a transient activity scanner 110. The transient activity scanner 110 may identify transient activity of an electronic device. The transient activity scanner 110 may scan or sweep the electrical measurement data with a window.

In general, a window as described herein, includes a position identifier and a window length that references segments of the electrical measurement data. The position identifier may vary during the sweep and reference various indices of the electrical measurement data. Also, the window may include multiple position identifiers such as, for example, corresponding window identifiers identifying a start and stop boundary of the window. By way of example, a window may refer include a start time (position identifier) and an end time (position identifier) that is offset by some duration (window length).

The window length may include a unit length with respect to the electrical measurement data. For example, the window length may be an offset from the position identifier of the window. Alternatively, or in addition, the window length may be the length between the start and stop position identifiers. A window is said to be fixed when the window length is fixed and does not change.

The transient activity scanner 110 may sweep electrical measurement data. Sweeping the data refers to moving the window along the electrical measurement data by incrementing the position of the window. Alternatively, or in addition, streaming electrical measurement data may be applied to a window such that the position index of the window changes with the electro measurement stream. During a sweep, the transient activity scanner 110 may derive calculated parameters of the electrical measurement data contained in the window. The calculated parameters may include average, min, max, or other mathematical calculations.

In some examples, a fixed window is used to sweep electrical measurement data to identify a transient event. When electrical measurement data in the fixed window satisfy transient event criteria, a start time for the transient event is detected. When electrical measurement data in the fixed window no longer satisfy the transient event criteria, an end time for the transient event is detected. The transient event criteria may include threshold start/stop criteria. For example, the transient event criteria may include transient start criteria that define the start of transient activity. Alternatively or in addition, the transient event criteria may include transient end criteria that specify an end to transient activity. By way of example, the transient start criteria may include transient event criteria that dictates transient activity starts when a calculated parameter exceeds a first threshold value. Transient end criteria may include a rule that transient activity ends when a calculated parameter is less than a second threshold parameter. A portion of the electrical measurement data may be isolated for a transient event based on the start and stop positions of a window. It should be appreciated that the transient event criteria may include multiple criteria that apply rules to multiple types of calculated parameters and electrical measurement data.

Figure 3:
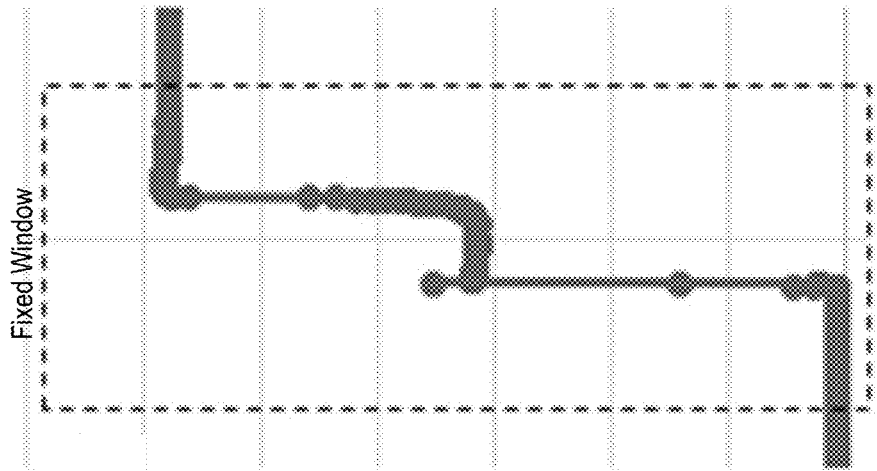
FIG. 3 illustrates a fixed window to capture transient events.
Figure 3:
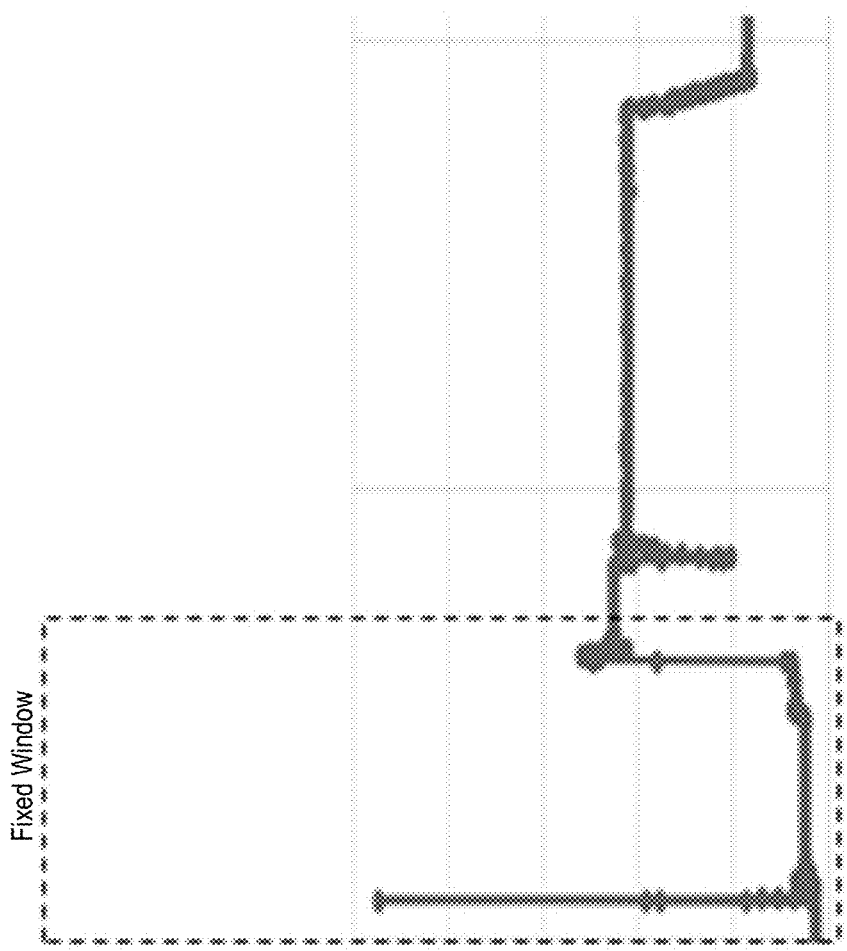

Fixed window transient detection with a single window may yield sub-optimal results. For example, when the transient time duration is longer than the fixed window length, important features for differentiating the device from others might not be present in the window. As illustrated in FIG. 3, fixed windows may capture a limited section of transient activity. On the other hand, when the fixed window length is long compared to the transient activity, the data becomes noisy or imbalanced resulting in missed or overlooked features. Moreover, unnecessary large windows increase the processing load for determining pattern recognition.

Accordingly, the transient activity scanner 110 may scan the captured measurement data using multiple scanning windows of fixed length to accurately identify transient events of variable length.

Figure 4:
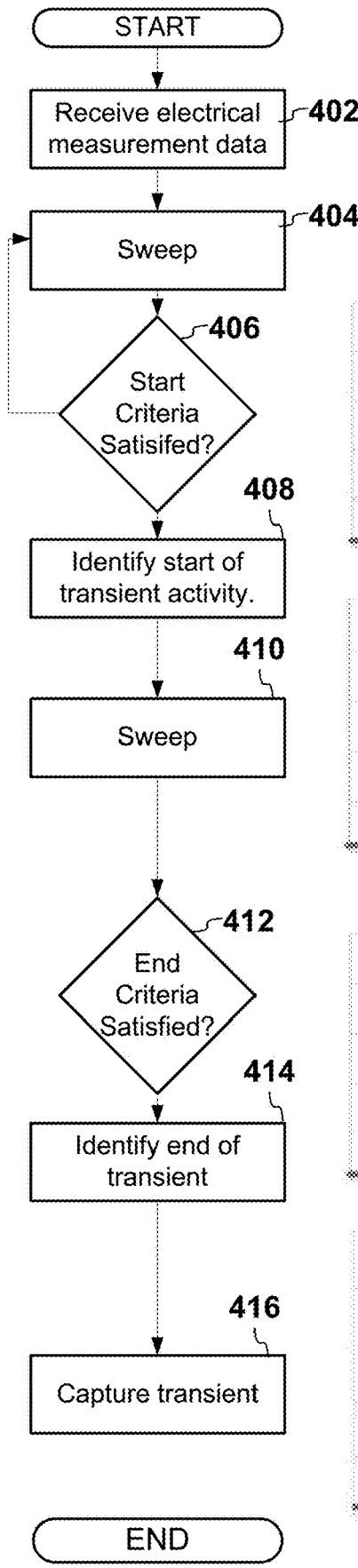
FIG. 4 illustrates example flow logic for a transient activity scanner with two scanning windows.
Figure 4:
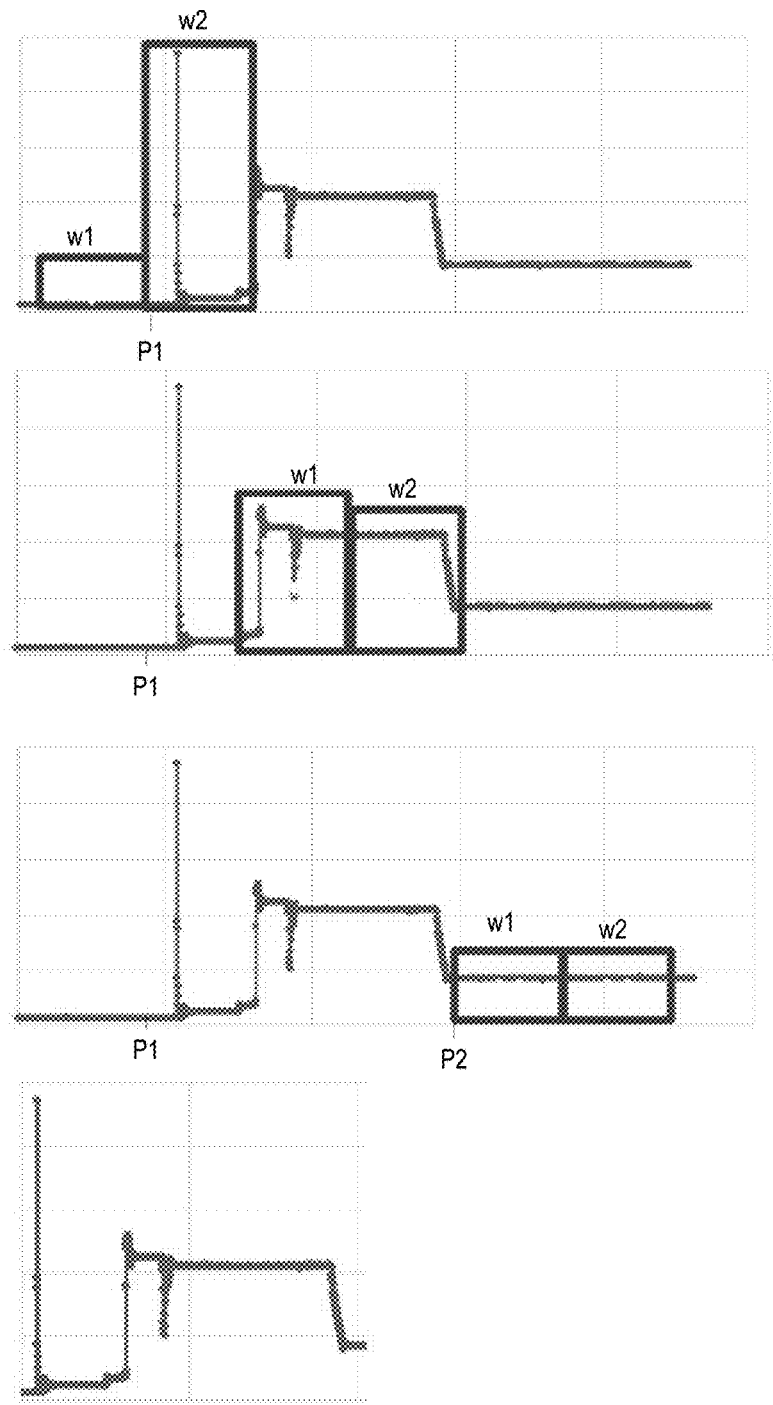

FIG. 4 illustrates an example flow logic for the transient activity scanner 110 with two scanning windows w1 and w2. The combined width of these scanning windows may be equivalent to the smallest transient duration that could be expected in an application (i.e. for example, the smallest transient duration that that historically occurs from electrical devices 106 shown in FIG. 1). The scanning window length may be configured by input by either human or machine. Alternatively or in addition, the transient activity scanner may be tuned or programed, whereby an identifiers for the electrical devices 106 is provided, and the transient activity scanner accesses a look-up table where the electrical device identifier is associated with a transient duration. Thus, if the transient activity scanner is configured to scan electrical measurement data from multiple electrical devices, it can access the look-up and then select the smallest transient window. Accordingly, the transient activity scanner may be configurable based on the particular set of electrical devices being monitored.

The transient activity scanner 110 may receive electrical measurement data (402). The transient activity scanner 110 may sweep the electrical measurement data with windows w1 and w2 (404). Windows w1 and w2 may each include a corresponding position identifiers, which identify position indices of the received electrical measurement data. For example, the start/end positions of the windows may increase to sweep (i.e. scan) the electrical measurement data. As the windows moved along the received data, parameters are calculated (e.g. average, max, min) and compared between the two windows. Thus, a first parameter may be calculated for the first window and a second parameter may be calculated for the second window. The parameters calculated during sweeping may include the mean, the maximum, the minimum, the gradient, the peak-to-peak variation, phase, harmonics and/or power factor of the measurement data inside the windows.

The transient activity scanner 110 may determine whether a transient start criteria is satisfied (406). In response to satisfaction of the transient start criteria the transient activity scanner 110 may identify a start of transient activity (408). Otherwise, the transient activity scanner 110 will continue to perform the sweep (404).

A transient start criteria may include a rule that compares the calculated parameters from the first window with calculated parameters from the second window. By way of example, a difference between the calculated parameters may be compared with a first threshold value. If there is a significant difference (i.e. a different greater than the first threshold value) between the parameters of the two windows, then a start position is stored for the beginning of a transient event. As illustrated in FIG. 4, the transient start position P1 is the index at the end of the first window w1, which also the index at the start of the second window w2. In other examples, other positions within the windows w1 and/or w2 may be used to mark the transient start position.

After identification of the transient start position, the transient activity scanner 110 may continue to sweep (410). During the sweeping, the transient activity scanner 110 may continue to calculate the parameters for each of the windows w1, w2.

The transient event detector 108 may determine whether and a transient end criteria is satisfied (412). The transient end criteria may include a rule that determines whether the transient end is completed. For example, the transient end criteria may include a rule that compares a first parameter calculated from the first window with a second parameter calculated from the second window w2. The transient end criteria may be satisfied when the difference is less than a second threshold value.

In response to satisfaction of the transient end criteria, the transient activity scanner 110 may identify the end of the transient (414). For example, the transient activity scanner 110 may generate an end time P2, which marks the end of transient period. The end time may be a time corresponding to the start of the first window, or any other suitable time along the first and second time window.

In some examples, the transient end criteria may include rules to handle anomalous transients. For example, if the transient is too long or there is some anomalous measurement data that causes the transient event detector 108 to improperly calculate the first and second parameters, the scanning will automatically stop at a predefined maximum scanning duration and will mark that as the end of the transient period.

Once the start position P1 and the end position P2 of the electrical measurement data for the transient is identified, the transient activity scanner 110 may capture the transient activity (416). For example, the electrical measurement data between p1 and p2 (which corresponds to the transient activity) is isolated and/or stored. Alternatively, or in addition, the transient activity data may be output to another device and/or provided to another component for further processing. For example, the transient event detector 108 may apply pattern recognition to identify the device.

In some examples, transient patterns of variable length increase the pattern recognition accuracy. However, optimizing a pattern recognition algorithm and/or machine learning model that accepts vectors of variable length as inputs may be prohibitive. Hence, once a transient event of variable length is captured, the transient event detector 108 may scale transient activity with pre-set duration.

Referring to FIG. 1, the system may include a transient activity scaler 112. The transient activity scaler 112 may stretch (see FIG. 5) and/or squash (see FIG. 6) the transient activity data.

Figure 5:
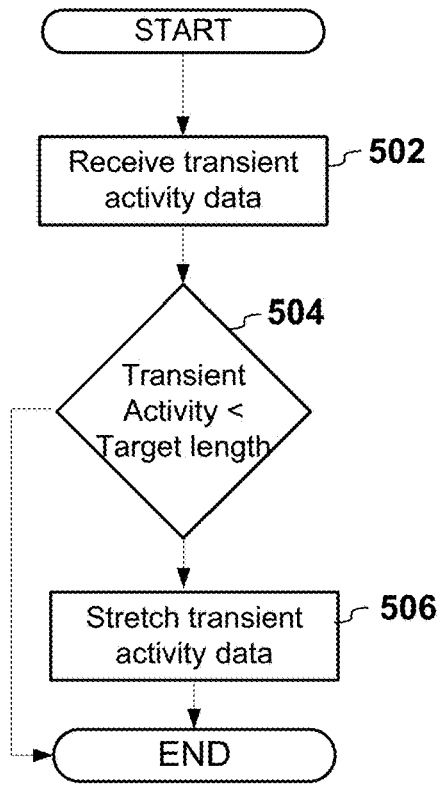
FIG. 5 illustrates example logic for a transient activity scaler for stretching transient measurement data.
Figure 5:
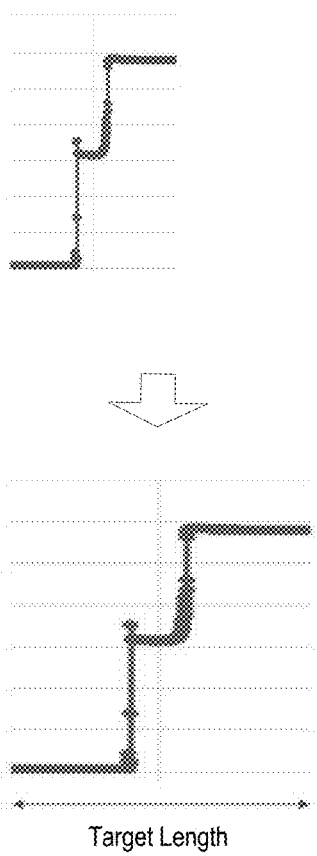

FIG. 5 illustrates example logic of the transient activity scaler 112 for stretching transient measurement data. The transient activity scaler 112 may receive transient activity data (502). The transient activity data may include a segment of the electrical measurement data isolated and captured by the transient activity scanner (FIG. 1).

The transient activity scaler 112 may determine whether the length of the transient activity data is smaller than a target length (504). The target length may include, for example, a unit length. For example, the unit length may include a target duration. In response to the length of the transient activity data being smaller than the preset transient length, the transient activity scanner may stretch the transient activity data (506). For example, the transient activity scaler 112 may interpolate values in the transient activity data to increase the length. By way of example, the present transient length may include a duration of X seconds and the transient activity scanner may interpolate values to increase the transient activity to X seconds.

Figure 6:
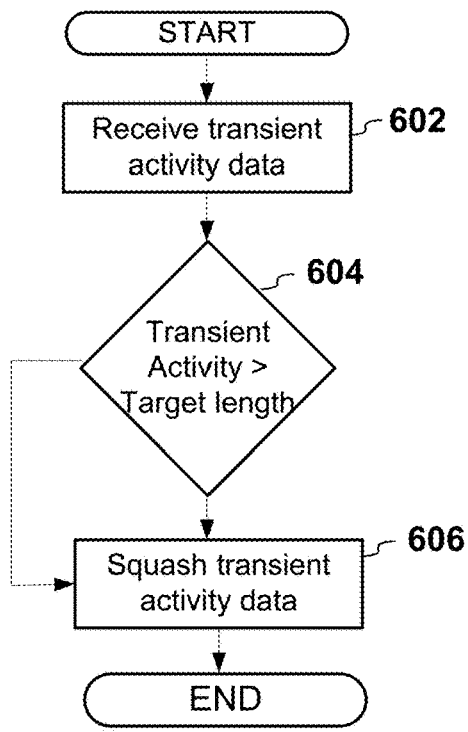
FIG. 6 illustrates example logic of a transient activity scaler for squashing the transient measurement data.
Figure 6:
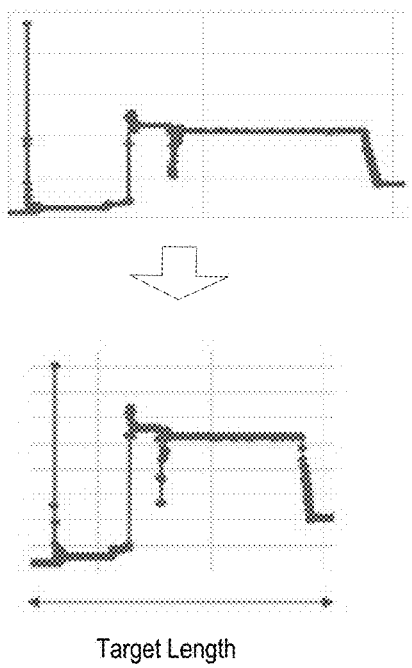

FIG. 6 illustrates example logic of the transient activity scaler 112 for squashing the transient measurement data. The transient activity scaler 112 may receive transient activity data (602). The transient activity scaler 112 may determine whether the length of the transient activity data is greater than a target length (604). In response to the length of the transient activity data being greater than a target length, the transient activity scanner may squash the transient activity data (606). For example, the transient activity scaler 112 may subsample the transient activity data to increase the length. By way of example, the present transient length may include a duration of Y seconds and the transient activity scanner may subsample the transient activity to Y seconds.

The stretching and/or squashing will allow the pattern recognition algorithm and/or machine learning model to accept input vectors with identical lengths. Since the entire transient is still included in the modified transient event window, most of the features are still present and can be used for device status identification.

Referring back to FIG. 1, the system may include a transient event classifier 112. The transient event classifier 112 may receive transient activity data, which is also described herein as electrical measurement data corresponding to transient operation on one or more electrical devices 106.

Based on the transient activity data, the transient event classifier 110 may differentiate devices, identify devices, categorize devices, and/or infer other attributes about the devices 106. Some devices 106 may have a large energy signature (few kilowatts) while some devices, (i.e. lamps and computers) will have a small energy signature (few Watts). It is difficult to optimize a pattern recognition technique that accept such a wide range of inputs. Hence the transient activity classifier 114 may categorize the transient events into different groups (e.g. large, medium, small energy signatures) based on transient amplitudes and pattern recognition technique is applied separately for each group. The transient detection and pattern recognition techniques described herein may be applied to current data, voltage data, power factor, harmonics, active power, reactive power or a combination of these parameters.

Transient activity classifier 114 may calculate up to the 10th harmonic of current and voltage data to optimize the classification of different transient patterns when other parameters such as current data, voltage data, power factor, active power or reactive power of the said transient patterns are similar.

Transient activity classifier 114 may include or access a machine learning model. By way of example, the transient activity scaler 114 may include an Artificial Neural Network (ANN) to perform inferences based on the transient data and/or features derived from the transient data. The artificial neural network may include trained information, such as weights and biases, gained form training data.

After transient activity is classified the system may generate transient event information. The transient event information may include or be associated with, the transient activity and the classification. The transient event information may be output to a viewable screen, a network interface, and/or stored a database. In some examples, the transient event information may include a link, that allows access to the transient event activity, or other information/calculations derived from the transient event activity. Alternatively or in addition, the transient event information may be sent as a notification. For example, the classification of transient activity classified with a classification that triggers a notification (i.e. a rule that evaluates the classification that, when triggered, causes the transient event information to be sent to a target, or multiple targets).

The system may further include a management system 116. The management system 116 may perform training for the ANN based on a machine learning framework. For example, the management system 116 may employ various types training methodologies including, for example, generalized and customized training. In generalized training methodology, labeled device transient patterns may be obtained by device manufacturers, and the training of the ANN would be performed by the management system 116. Once the train is done, the calculated network may be executed by the sensor node 102 and/or the transient event detector 108. In other examples, the calculated network may be executed by a external device, such as the management system 116. For example, the transient event detection system may execute as a stand-alone unit that measures current, voltage and power factor, calculate power values, detect transients, apply pattern recognition and identify device operating statuses and transmit that data to an external entity that accesses the ANN.

Customized training is a progressive training methodology where the network parameters are updated based on user input, in NILM applications where increased accuracy is important. In customized training, reevaluation of these parameters may be done on multiple distributed computing units based on data collected at the installation site.

The system 100 may be implemented with additional, different, or fewer components than illustrated. Each component may include additional, different, or fewer components.

Figure 7:
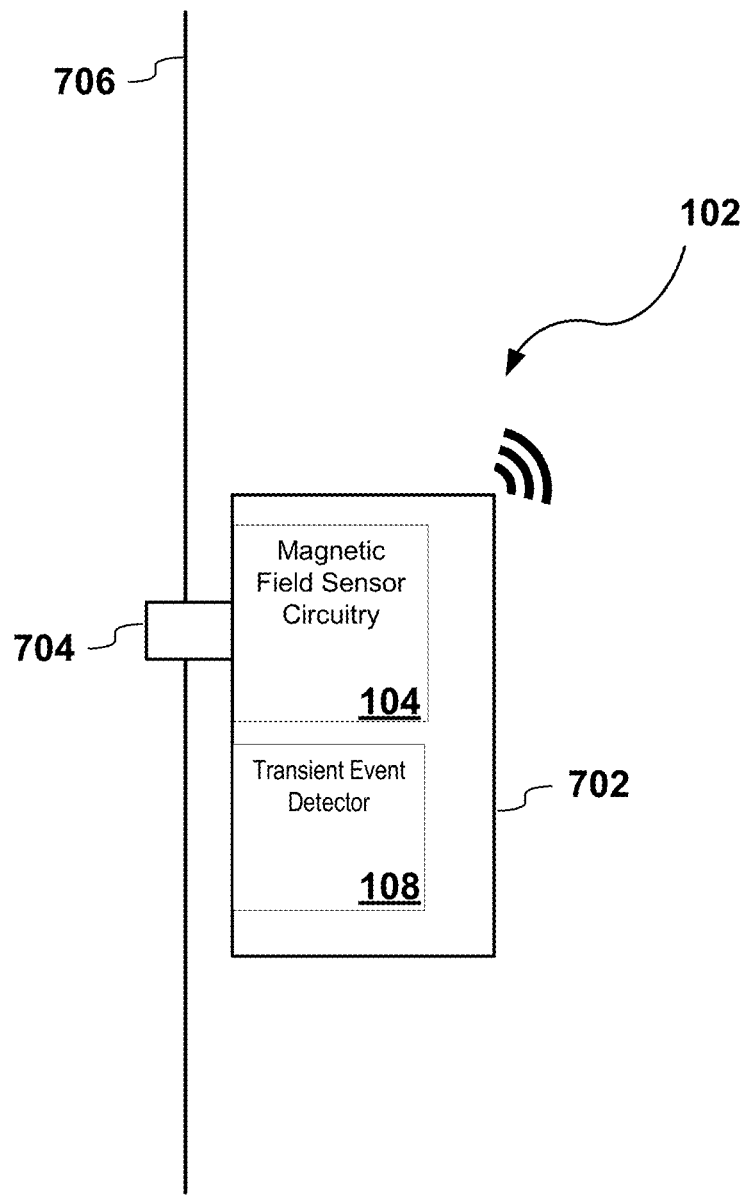
FIG. 7 illustrates an example of a sensor node with a housing and a clip.

FIG. 7 illustrates an example of the sensor node 102 with a housing 702 and a clip 704. The housing may include a rigid structure. The magnetic field circuitry 104 and the transient event detector 108 may be disposed, or partially disposed, within the housing 702. The housing 702 may include or be attached to a clip 704. The clip 704 may be detachably coupled to a wire 706 (which may be, for example, the supply line S illustrated in FIG. 1). In some examples, the clip 704 may include the magnetic field sensor 105 (shown see FIG. 1).

Figure 8:
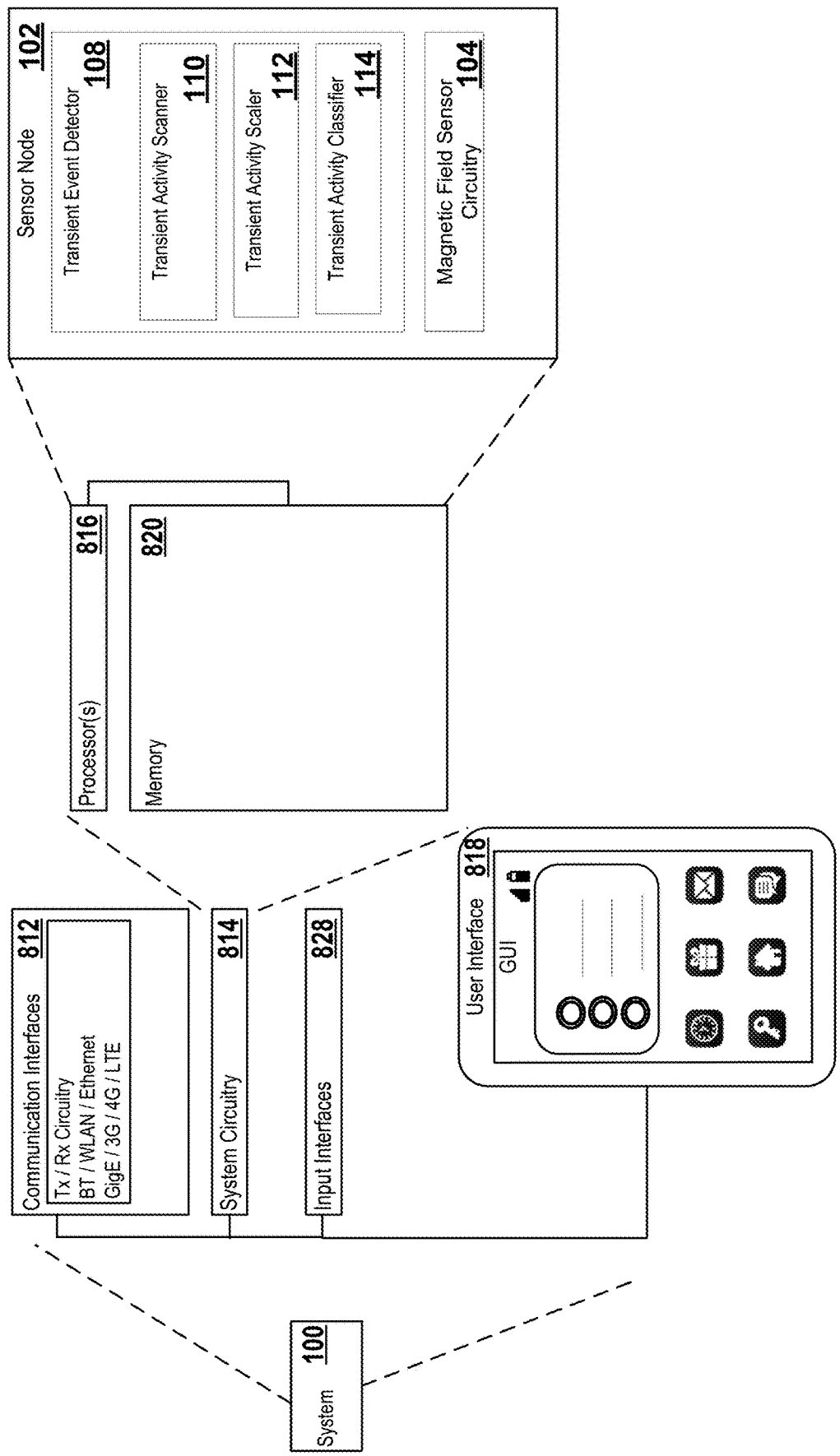
FIG. 8 illustrates a second example of a system.

FIG. 8 illustrates a second example of the system 100. The system 100 may include communication interfaces 812, input interfaces 828 and/or system circuitry 814. The system circuitry 814 may include a processor 816 or multiple processors. Alternatively, or in addition, the system circuitry 814 may include memory 820.

The processor 816 may be in communication with the memory 820. In some examples, the processor 816 may also be in communication with additional elements, such as the communication interfaces 812, the input interfaces 828, and/or the user interface 818. Examples of the processor 816 may include a general processor, a central processing unit, logical CPUs/arrays, a microcontroller, a server, an application specific integrated circuit (ASIC), a digital signal processor, a field programmable gate array (FPGA), and/or a digital circuit, analog circuit, or some combination thereof.

The processor 816 may be one or more devices operable to execute logic. The logic may include computer executable instructions or computer code stored in the memory 820 or in other memory that when executed by the processor 816, cause the processor 816 to perform the operations of the sensor node 102, the transient event detector 108, transient activity scanner 110, the transient activity scaler 112, the transient activity classifier 114, the magnetic field sensor circuitry, the system and/or the system 100. The computer code may include instructions executable with the processor 816.

The memory 820 may be any device for storing and retrieving data or any combination thereof. The memory 820 may include non-volatile and/or volatile memory, such as a random access memory (RAM), a read-only memory (ROM), an erasable programmable read-only memory (EPROM), or flash memory. Alternatively or in addition, the memory 820 may include an optical, magnetic (hard-drive), solid-state drive or any other form of data storage device. The memory 820 may include at least one of the sensor node 102, the transient event detector 108, the transient activity scanner 110, the transient activity scaler 112, the transient activity classifier 114, the magnetic field sensor circuitry, the system and/or the system 100. Alternatively or in addition, the memory may include any other component or subcomponent of the system 100 described herein.

The user interface 818 may include any interface for displaying graphical information. The system circuitry 814 and/or the communications interface(s) 812 may communicate signals or commands to the user interface 818 that cause the user interface to display graphical information. Alternatively or in addition, the user interface 818 may be remote to the system 100 and the system circuitry 814 and/or communication interface(s) may communicate instructions, such as HTML, to the user interface to cause the user interface to display, compile, and/or render information content. In some examples, the content displayed by the user interface 818 may be interactive or responsive to user input. For example, the user interface 818 may communicate signals, messages, and/or information back to the communications interface 812 or system circuitry 814.

The system 100 may be implemented in many different ways. In some examples, the system 100 may be implemented with one or more logical components. For example, the logical components of the system 100 may be hardware or a combination of hardware and software. The logical components may include the transient event detector 108, transient activity scanner 110, the transient activity scaler 112, the transient activity classifier 114, the magnetic field sensor circuitry, the system 100, and/or any component or subcomponent of the system 100. In some examples, each logic component may include an application specific integrated circuit (ASIC), a Field Programmable Gate Array (FPGA), a digital logic circuit, an analog circuit, a combination of discrete circuits, gates, or any other type of hardware or combination thereof. Alternatively or in addition, each component may include memory hardware, such as a portion of the memory 820, for example, that comprises instructions executable with the processor 816 or other processor to implement one or more of the features of the logical components. When any one of the logical components includes the portion of the memory that comprises instructions executable with the processor 816, the component may or may not include the processor 816. In some examples, each logical component may just be the portion of the memory 820 or other physical memory that comprises instructions executable with the processor 816, or other processor(s), to implement the features of the corresponding component without the component including any other hardware. Because each component includes at least some hardware even when the included hardware comprises software, each component may be interchangeably referred to as a hardware component.

Some features are shown stored in a computer readable storage medium (for example, as logic implemented as computer executable instructions or as data structures in memory). All or part of the system and its logic and data structures may be stored on, distributed across, or read from one or more types of computer readable storage media. Examples of the computer readable storage medium may include a hard disk, a flash drive, a cache, volatile memory, non-volatile memory, RAM, flash memory, or any other type of computer readable storage medium or storage media. The computer readable storage medium may include any type of non-transitory computer readable medium, such as a volatile memory, a non-volatile memory, ROM, RAM, or any other suitable storage device.

The processing capability of the system may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library, such as a shared library (for example, a dynamic link library (DLL).

All of the discussion, regardless of the particular implementation described, is illustrative in nature, rather than limiting. For example, although selected aspects, features, or components of the implementations are depicted as being stored in memory(s), all or part of the system or systems may be stored on, distributed across, or read from other computer readable storage media, for example, secondary storage devices such as hard disks, flash memory drives, and CD-ROMs. Moreover, the various logical units, circuitry and screen display functionality is but one example of such functionality and any other configurations encompassing similar functionality are possible.

The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one example, the instructions are stored on a removable media device for reading by local or remote systems. In other examples, the logic or instructions are stored in a remote location for transfer through a computer network or over telephone lines. In yet other examples, the logic or instructions are stored within a given computer and/or central processing unit ("CPU").

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same apparatus executing a same program or different programs. The components may be resident on separate hardware, such as separate removable circuit boards, or share common hardware, such as a same memory and processor for implementing instructions from the memory. Programs may be parts of a single program, separate programs, or distributed across several memories and processors.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A non-intrusive load monitoring system, comprising:
   a non-intrusive sensor circuitry configured to provide electrical measurement data comprising current data and voltage data, power factor data, active power consumption data, reactive power consumption data, or a combination thereof; and
   a transient event detector configured to:
      sweep the electrical measurement data with a first window having a first position identifier and a second window having a second position identifier, the first window being adjacent to the second window;
      identify, at a first index of the electrical measurement data, a start of transient activity based on electrical measurement data referenced by a first window and electrical measurement data referenced by the second window;
      identify, at a second index of the electrical measurement data, an end of transient activity based on electrical measurement data referenced by the first window and electrical measurement data referenced by the second window; and
      capture a transient activity data vector comprising a portion of the electrical measurement data between first index and the second index.

2. The non-intrusive load monitoring system of claim 1, wherein the transient event detector is further configured to:
   determine, at the first index of the electrical measurement data, a first value calculated from electrical measurement data referenced by the first window and a second value calculated from electrical measurement data referenced by the second window;
   store the first index in response to the first value and second value satisfying transient start criteria;
   determine, at a second index of the electrical measurement data, a third value calculated from electrical measurement data in the first window and a second value calculated from electrical measurement data in the second window satisfies transient stop criteria; and
   store the second index in response to the third value and fourth value satisfying transient stop criteria.

3. The non-intrusive load monitoring system of claim 1, wherein the second position identifier is greater than the first position identifier.

4. The non-intrusive load monitoring system of claim 1, wherein to sweep the electrical measurement data, the transient event detector is further configured to:
   repeatedly update the first position identifier and the second position identifier to incrementally reference the electrical measurement data.

5. The non-intrusive load monitoring system of claim 1, wherein the non-intrusive sensor circuitry is configured to measure a common supply voltage and a current consumption of an adjacent power supply point of a plurality of electronic devices.

6. The non-intrusive load monitoring system of claim 5, further comprising a housing that includes the non-intrusive sensor circuitry and the transient event detector.

7. The non-intrusive load monitoring system of claim 6, wherein the housing is configured to clip on to a wire.

8. The non-intrusive load monitoring system of claim 5, wherein the transient activity data vector comprises measurements of transient current, voltage, active power and/or reactive power, wherein the transient event detector is further configured to:
   scale a plurality of transient activity data vectors into corresponding fixed-length vectors, the fixed length vectors having the same length; and
   determine, based an artificial neural network, that at least one of the fixed-length vectors corresponds to at least one of the electronic devices.

9. The non-intrusive load monitoring system of claim 1, wherein the transient event detector is further configured to calculate the power factor, reactive and active power values, and harmonic content based on current and voltage readings.

10. The non-intrusive load monitoring system of claim 1, wherein the transient event detector is further configured to:
    receive a plurality of transient activity data vectors captured by a transient event detector, the transient activity data vectors each having different lengths or time durations; and
    scale the transient activity data segments by stretching or subsampling to a pre-set length or a present time duration.

11. The non-intrusive load monitoring system of claim 10, wherein the transient event detector is further configured to:
    execute pattern recognition on transient activity data segments containing transients of current, voltage, active power and/or reactive power.

12. The non-intrusive load monitoring system of claim 10, wherein the transient event detector is further configured to:
    determine current harmonics and/or voltage harmonics to increase the accuracy of transient differentiation.

13. A method comprising:
    receiving, by a hardware processor, electrical measurement data comprising current data and voltage data, power factor data, active power consumption data, reactive power consumption data, or a combination thereof;
    sweeping the electrical measurement data with a first window having a first position identifier and a second window having a second position identifier, the first window being adjacent to the second window;
    identifying, at a first index of the electrical measurement data, a start of transient activity based on electrical measurement data referenced by a first window and electrical measurement data referenced by the second window;

identifying, at a second index of the electrical measurement data, an end of transient activity based on electrical measurement data referenced by the first window and electrical measurement data referenced by the second window; and capturing transient activity data comprising a portion of the electrical measurement data between first index and the second index.

14. The method of claim 13, further comprising:

determining, at the first index of the electrical measurement data, a first value calculated from electrical measurement data referenced by the first window and a second value calculated from electrical measurement data referenced by the second window;

storing the first index in response to the first value and second value satisfying transient start criteria;

determining, at a second index of the electrical measurement data, a third value calculated from electrical measurement data in the first window and a second value calculated from electrical measurement data in the second window satisfy transient stop criteria; and storing the second index in response to the third value and the fourth value satisfying the transient stop criteria.

15. The method of claim 13, further comprising:

capturing a plurality of transient activity data vectors corresponding to transients of a plurality of respective electrical devices, the transient activity data vectors each having different lengths; and scaling the transient activity data vectors to a fixed length by stretching or subsampling at least one of the vectors.

16. The non-intrusive load monitoring system of claim 15, wherein the transient event detector is further configured to:

identify, based on a machine learning model, a device that generated a transient corresponding to at least one of the scaled transient activity data vectors; and output a transient event notification identifying the device.

* * * * *